(12) United States Patent
Schwarz et al.

(10) Patent No.: US 8,768,643 B2
(45) Date of Patent: Jul. 1, 2014

(54) METHOD AND APPARATUS FOR PARALLEL TESTING OF SEMICONDUCTOR DEVICES

(75) Inventors: Yoram Schwarz, Santa Clara, CA (US); Ryan Clarke, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 337 days.

(21) Appl. No.: 13/104,742

(22) Filed: May 10, 2011

(65) Prior Publication Data

US 2012/0290245 A1 Nov. 15, 2012

(51) Int. Cl.
*G01R 27/28* (2006.01)
*G01R 31/00* (2006.01)
*G01R 31/14* (2006.01)
*G01L 15/00* (2006.01)

(52) U.S. Cl.
USPC .......................................... 702/121; 702/118

(58) Field of Classification Search
USPC .................................................. 702/121, 118
See application file for complete search history.

(56) References Cited

U.S. PATENT DOCUMENTS

| | | | | |
|---|---|---|---|---|
| 6,630,986 B2 * | 10/2003 | Inoue et al. | ..................... | 355/53 |
| 6,668,230 B2 * | 12/2003 | Mansky et al. | ................. | 506/39 |
| 2010/0001269 A1 * | 1/2010 | Verma et al. | ..................... | 257/48 |

* cited by examiner

*Primary Examiner* — John Breene
*Assistant Examiner* — Manuel Rivera Vargas

(57) ABSTRACT

Method and apparatus for parallel testing of multiple regions on a substrate used in high performance combinatorial development of new materials and processes are described. The apparatus comprises dedicated hardware for each probe assembly with multiple PC controllers networked using a master/slave configuration.

6 Claims, 4 Drawing Sheets

METHOD AND APPARATUS FOR PARALLEL TESTING OF SEMICONDUCTOR DEVICES

FIELD OF THE INVENTION

The present invention relates generally to systems and methods for the parallel, high throughput electrical testing of samples in an R&D environment.

BACKGROUND OF THE INVENTION

The manufacture of integrated circuits (IC), semiconductor devices, flat panel displays, optoelectronics devices, data storage devices, magneto-electronic devices, magneto-optic devices, packaged devices, and the like entails the integration and sequencing of many unit processing steps. As an example, IC manufacturing typically includes a series of processing steps such as cleaning, surface preparation, deposition, lithography, patterning, etching, planarization, implantation, thermal annealing, and other related unit processing steps. The precise sequencing and integration of the unit processing steps enables the formation of functional devices meeting desired performance metrics such as speed, power consumption, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, and U.S. Pat. No. 7,902,063 filed on Feb. 10, 2006 which are all herein incorporated by reference.

Typically, during the screening of new materials and processes using HPC methods, each of the regions within the substrate must be tested and the results used to select candidate materials or candidate process conditions for the next level of screening or development. In an R&D environment, the testing, analysis, and evaluation phase can become a bottleneck slowing the rate of discovery and innovation due to long testing times and serial testing protocols. This can lead to the inefficient use of resources, increased costs, and long development times.

Therefore, there is a need to develop systems and methods for increasing the throughput of testing, analysis, and evaluation activities in an R&D environment when using HPC techniques.

SUMMARY OF THE INVENTION

In some embodiments of the present invention, redundant hardware is used to allow the concurrent testing of multiple test sites or multiple regions within a sample. The tests are synchronized through the use of a master/slave network configuration wherein each assembly of test hardware operates independently but is coordinated by a central controller.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
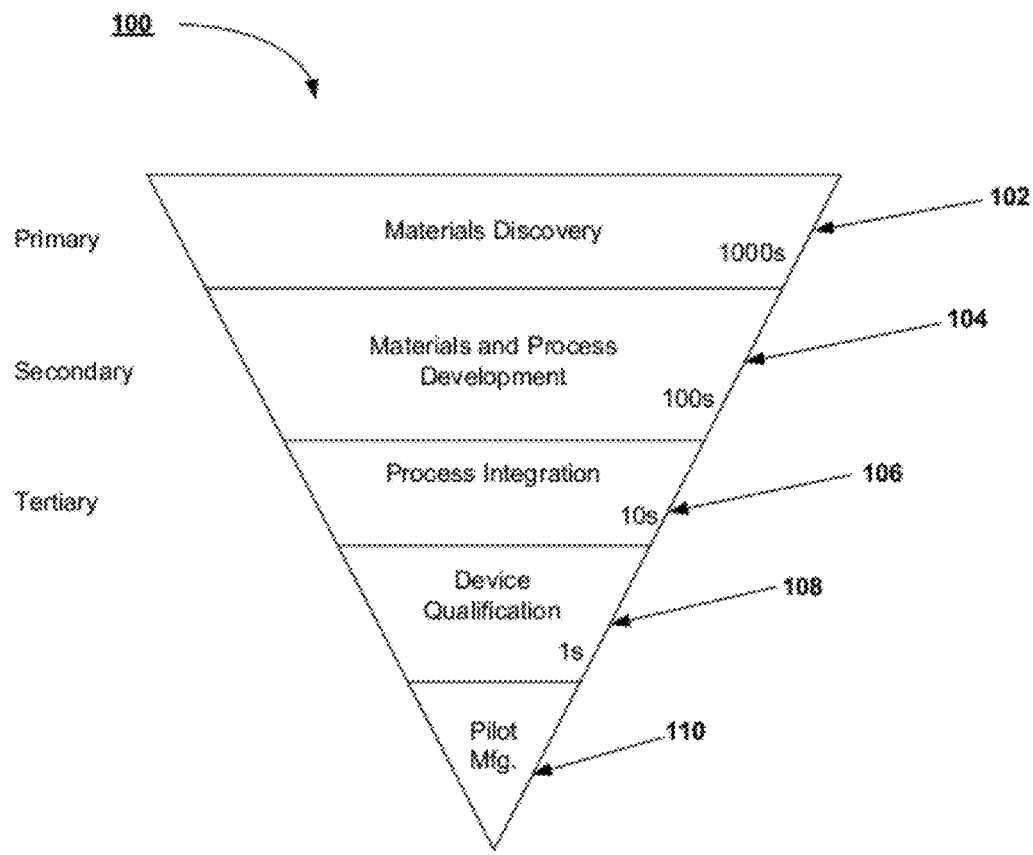
FIG. 1 is a schematic diagram for implementing combinatorial processing and evaluation.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing wafers into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full wafers within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes and process sequence used to build that portion of the device or structure. During the processing of some embodiments described herein, structures are formed on the processed semiconductor substrate that are equivalent to the structures formed during actual production of the semiconductor device. For example, such structures may include, but would not be limited to, trenches, vias, interconnect lines, capping layers, masking layers, diodes, memory elements, gate stacks, transistors, or any other series of layers or unit processes that create an intermediate structure found on semiconductor chips. While the combinatorial processing varies certain materials, unit processes, or process sequences, the composition or thickness of the layers or structures or the action of the unit process, such as cleaning, surface preparation, etch, deposition, planarization, implantation, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
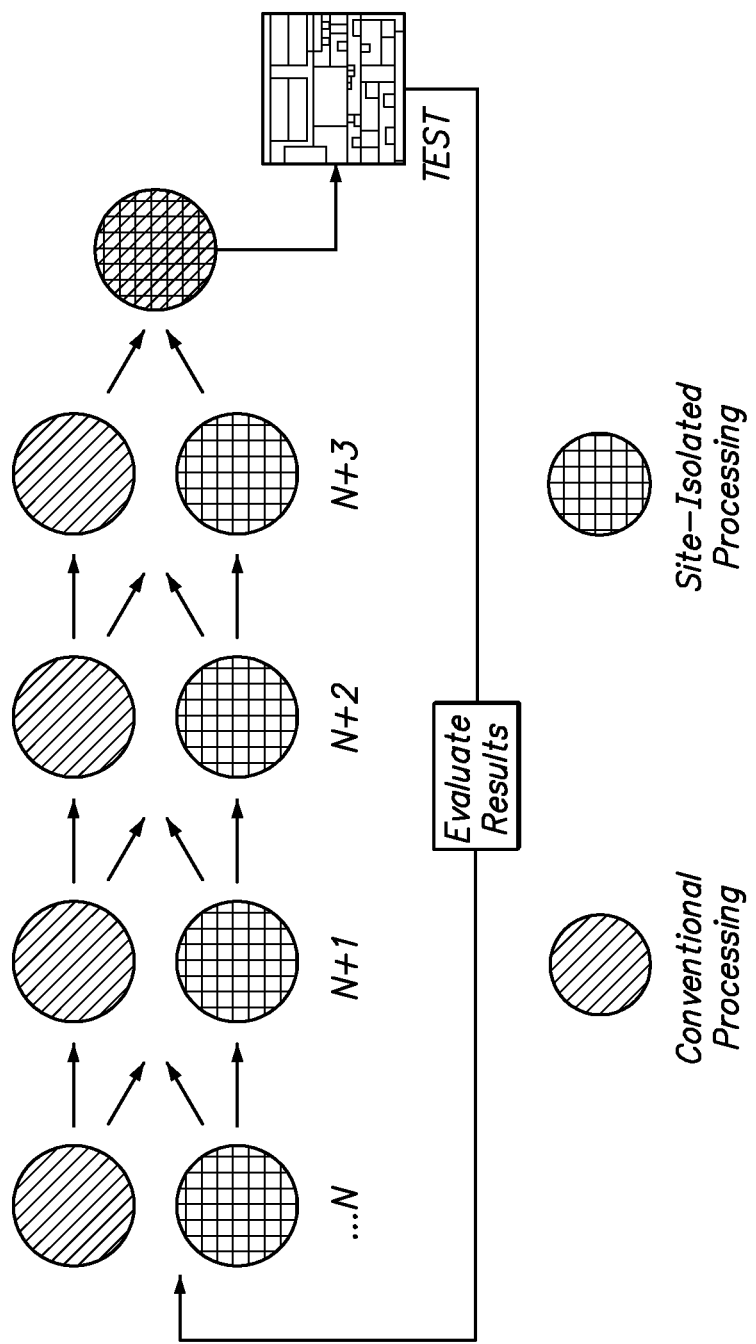
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, e.g. wafers as shown or portions of monolithic substrates such as coupons or wafer coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. It should be appreciated that these process parameters are exemplary and not meant to be an exhaustive list as other process parameters commonly used in semiconductor manufacturing may be varied.

As mentioned above, within a region the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3B:
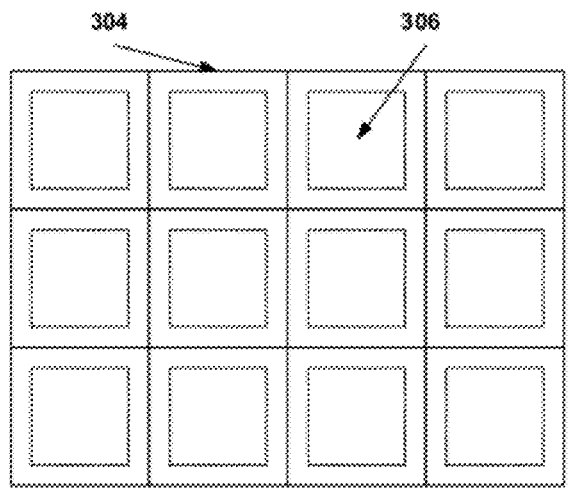
FIGS. 3A-3C are schematic diagrams illustrating various testing configurations on the samples.
Figure 3A:
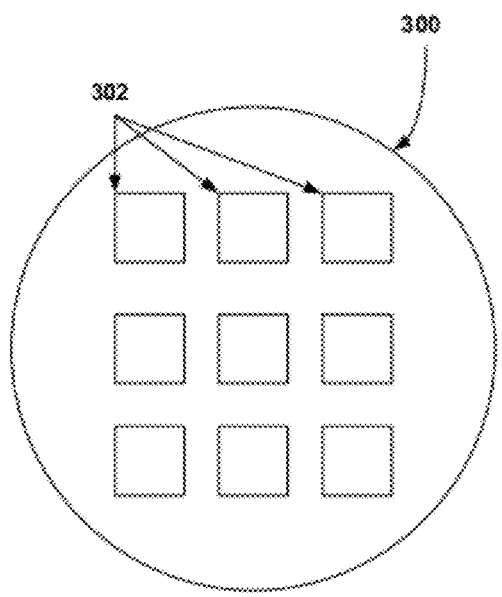
Figure 3C:
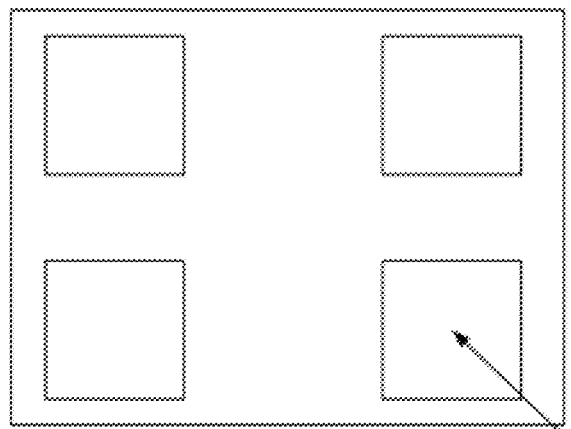

FIGS. 3A-C are simplified schematic diagrams illustrating isolated and slightly overlapping regions in accordance with one embodiment of the invention. In FIG. 3A, wafer 300 is illustrated having multiple regions 302, which generally contains multiple dies or structures. It should be appreciated that while wafer 300 is illustrated, the regions discussed herein may be disposed on a coupon or some portion of a wafer. FIG. 3B illustrates adjacent regions 304. Each instance of regions 304 shares a border with another of the regions. Within each region 304, a substantial portion 306 of the region is uniform, e.g., at least 50% or more of the region, and the desired testing can be performed within portion 306. One skilled in the art will appreciate that the shadowing between the regions 304 may occur when masks are used for the unit processing operations. However, this phenomenon does not impact the ability to produce and test the substantial portion 306 of the region, which has the desired uniform and consistent characteristics.

FIG. 3C illustrates an exemplary region having several die. In general regions will contain more than one die, but the system or series of experiments can be set up so that each region contains one die or a portion of a die, if applicable. It should be appreciated that the tools defined herein enable spatial variation of features across layers. While FIGS. 3A-C may be interpreted as defining regions, this is not meant to be limiting. The region may be defined by the design of experiment, tooling or other site isolated processing techniques as required for the technology at issue, which include, manufacturing of integrated circuits (IC) semiconductor devices, flat panel displays, optoelectronics devices, data storage devices, magneto electronic devices, magneto optic devices, packaged devices, and the like. As described above, regardless of the size of the region and the regions correlation to the die size, the regions may be slightly overlapping or isolated without impacting the screening technique described herein.

In one embodiment, the primary and secondary testing may occur on a coupon, while the tertiary testing is performed on a production size wafer. Through this multi-level screening process, the best possible candidates have been identified from many thousands of options. The time required to perform this type of screening will vary, however, the efficiencies gained through the HPC methods provide a much faster development system than any conventional technique or scheme. While these stages are defined as primary, second and tertiary, these are arbitrary labels placed on these steps. Furthermore, primary screening is not necessarily limited to materials research and can be focused on unit processes or process sequences, but generally involves a simpler substrate, less steps and quicker testing than the later screening levels.

The subsections of test structures generated from previous testing for some screening levels may be incorporated into subsequent, more complex screening levels in order to further evaluate the effectiveness of process sequence integrations and to provide a check and correlation vehicle to the previous screen. It should be appreciated that this ability allows a developer to see how results of the subsequent process differed from the results of the previous process, i.e., take into account process interactions. In one example, materials compatibility may be used as a primary test vehicle in primary screening, then specific structures incorporating those materials (carried forward from the primary screen) are used for the secondary screening. As mentioned herein, the results of the secondary screening may be fed back into the primary screening also. Then, the number and variety of test structures is increased in tertiary screening along with the types of testing, for example, electrical testing may be added or device characterization may be tested to determine whether certain critical parameters are met. Of course, electrical testing is not reserved for tertiary testing as electrical testing may be performed at other screening stages. The critical parameters generally focus on the requirements necessary to integrate the structures created from the materials and process sequence into the commercial product, e.g., a semiconductor die.

At each stage of the development and screening of new materials and/or processes, the various regions of the substrates must be tested, analyzed, and evaluated in a high throughput and efficient manner. A wide variety of analytical tools and methods may be employed depending on the material property that is being tested. One important class of material properties is the electrical characteristics of the material. Examples of some properties that can be evaluated include current versus voltage (UV) behavior for dielectric materials, capacitance (C) behavior for dielectric materials, time dependent dielectric breakdown (TDDB) behavior for dielectric materials, sheet resistance for conductive materials, resistance change and state for resistive random access memory (ReRAM) materials, etc.

Figure 4:
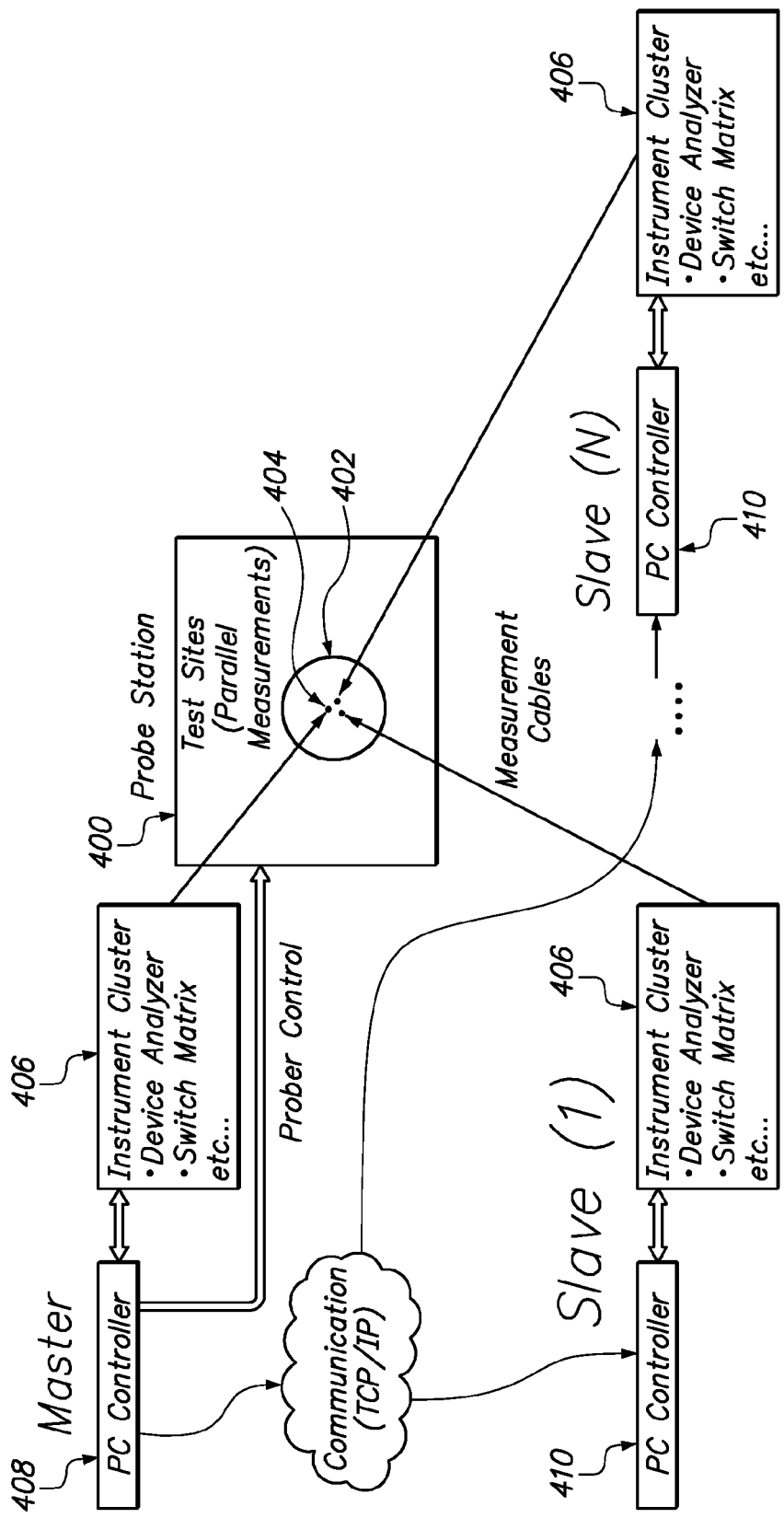
FIG. 4 illustrates a schematic of the testing and network architecture of one embodiment.

In an R&D environment, each of the regions of the substrate must be tested, analyzed, and evaluated so that promising material or process candidates may be selected for the next phase of the screening. In the case of testing electrical characteristics, this is typically accomplished using an electrical testing probe station and associated data collection network. FIG. 4 illustrates a schematic of the testing and network architecture of one embodiment of such an assembly.

FIG. 4 illustrates a probe station, 400, with sample, 402, containing test sites, 404. Typically, probe station, 400, contains a sample stage that can be manipulated in the x, y, and z orthogonal directions. Advantageously, the stage can be manipulated automatically using servo motors under the control of a computer system. This obviates the need to have a technician manually manipulate the sample stage to move to each of the test regions. Typically, electrical probe stations have two probe assemblies (not shown), each probe assembly comprising two probe tips (not shown) that contact the samples at the test sites. The probe assemblies are electrically connected to an instrument cluster, 406. Depending on the nature of the electrical test, the instrument cluster may contain hardware such as power supplies, current sources, voltage sources, waveform generators, digital multimeters, device analyzers, a switch matrix, etc. Advantageously, the instrument cluster, 406, can be interfaced to a computer to allow for automatic test signal generation and automatic data collection during the test sequences.

Also shown in FIG. 4 is master personal computer (PC) controller, 408. Master PC controller, 408, contains software programs and algorithms for manipulating the probe station sample stage (i.e. probe control) and software programs and algorithms for commanding the instrument cluster, 406, to generate test signals and to collect and store data during the test. The software programs and algorithms are typically developed and optimized for use with a single instrument cluster and a single probe assembly. It is not uncommon for electrical tests to require from about 10 minutes to about 90 minutes to complete the testing of all of the regions on a single sample in an R&D environment where HPC techniques are being used.

A number of strategies have been tried to address the throughput deficiency at the electrical test phase of HPC material and process development. Additional probe assemblies can be added to the probe station to allow parallel testing activities. In some cases, the hardware in the instrument cluster may have additional channels that can be used to generate test signals and pass the data back to the PC controller for storage and analysis. However, in some cases, duplicate hardware must be used to interface to the added probe assemblies.

One strategy for managing parallel testing when multiple probe assemblies are being used is to interleave the test signals and data collection among the various probe assemblies in time. Essentially, this shares the resources across the available probe assemblies. There are a number of problems with this strategy. The testing is not truly parallel in that some probe assemblies are idle while one probe assembly is actively testing its sample. Additionally, it is not uncommon for interleaved testing assemblies to become unstable. The measurement conditions are not ideal under this strategy because the testing resources are being shared and the quality of the data may not be as good as tests completed with dedicated resources. Furthermore, if several probe assemblies are used, the test time for a specific test may increase due to execution bottlenecks due to complex resource management. Lastly, the software programs and algorithms require extensive customization to efficiently execute the interleaved testing protocols. If new tests, testing conditions, or testing sequences are developed, the system requires additional customization. This hinders the ability to duplicate the testing system and generate consistent testing methodologies and accurate test data across multiple locations. The additional time and effort involved in the maintenance of the customization often negate any benefits gained from parallel testing.

In some embodiments of the present invention, additional probe assemblies, have been added to the probe station to allow parallel (i.e. concurrent) testing activities as shown in FIG. 4. In some cases, the hardware in the instrument cluster has additional, independent channels that can be used to generate test signals and pass the data back to the PC controller for storage and analysis. However, in some cases, duplicate hardware has been used to interface to the added probe assemblies. In some embodiments, each probe assembly has a dedicated instrument cluster and a dedicated PC controller, 410, as shown in FIG. 4.

The PC controllers, 410, are connected via a network to the master PC controller, 408, discussed previously. It is critical that the parallel testing be coordinated and synchronized. Therefore, the network of PC controllers is configured in a master/slave configuration. The master PC controller, 408, controls the movement of the sample stage of the probe station, executes the tests requested using one of the probe assemblies, and synchronizes the start of the tests controlled by the remaining slave PC controllers, 410. Once the slave PC controllers are given the command to initiate their testing, they operate autonomously and independently. When they have completed their testing sequence, the slave PC controllers inform the master PC controller and wait for the next signal to initiate the next sequence of tests.

This configuration and strategy has several benefits. Since the hardware is truly independent, (i.e. no shared resources), the testing is truly executed in a parallel manner and the testing is completed under optimized conditions without interference from other testing protocols. The slave PC controllers operate autonomously, so there are no execution bottlenecks and no complex resource management issues. Finally, the software programs and algorithms are the same as those optimized for a single probe assembly since each slave PC controller is self sufficient. Therefore, there is no need to develop and maintain complex customization to test multiple test sites simultaneously. This has the added advantage that it is straightforward to duplicate the hardware and software and to generate consistent testing methodologies and accurate test data across multiple locations. Finally, this configuration is scalable and is only limited by the physical limitations of the number of probe assemblies that can be configured within the testing envelope of the multiple test regions on the substrates.

The master/slave independent strategy has an additional benefit in that the electrical tests performed by each probe assembly may be the same or may be different. For example, all the probe assemblies might be measuring the capacitance of a dielectric material. In another example, one probe assembly might be measuring the capacitance of a dielectric material in one test region of the sample while another probe assembly is measuring the sheet resistance of a conductive material in another region of the sample. This flexibility may not be possible in the interleaved strategy discussed previously since the various tests must share resources, depending on the implementation.

In one example of the benefits of some embodiments, a series of tests on the regions of a sample required about 90 minutes using a probe station with a single probe assembly. A second probe assembly was installed with its dedicated instrument cluster and PC controller. The additional PC controller was networked to the master PC controller in a master/slave configuration. The same software programs and algorithms for test signal generation and data retrieval and storage were used on both the master and slave PC controllers. No additional software coding or customization was required. The master PC controller manipulated the sample stage of the probe station to the correct coordinates and caused the probe tips to engage the sample at the proper test locations. The master PC controller then sent a "ready" signal to the slave PC controller to initiate the test sequence. Each PC controller executed its test protocol autonomously and independently. When both testing sequences were complete, the master PC controller manipulated the sample stage to the next set of coordinates and the cycle was repeated until the testing of the sample was complete. Using this configuration and strategy, the test time for testing a substrate with multiple devices was reduced to about 45 minutes, a 2× improvement. If an interleaving strategy had been used, the improvement would have been less than 2×. The addition of a third probe assembly and associated hardware would decrease the test time to about 30 minutes, a 3× improvement. Therefore, if N is the total number of parallel systems and T is the device test time, then an improvement of T/N will be realized when compared to a single probe assembly and associated hardware. Those skilled in the art will understand that practical limitations will arise due to the physical space required to add additional probe assemblies, test algorithm details and device response, probing layout, and there will be a limitation imposed by the number of test devices on the substrate.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A system for the parallel testing of test sites on a sample, the system consisting of:
    a. a probe station comprising a sample stage and at least two probe assemblies, wherein each probe assembly has two probe tips;
    b. an instrument cluster associated with each of the probe assemblies, wherein the instrument cluster consists of a power supply, current source, voltage source, waveform generator, digital multimeter, device analyzer, and switch matrix that operate to test an electrical property of a material formed on multiple site isolated regions of a sample in a high productivity combinatorial manner;
    c. a Personal Computer (PC) controller associated with each of the probe assemblies and its associated instrument cluster wherein hardware in the instrument cluster has additional, independent channels that are used to generate signals and pass data to the PC controller for storage and analysis;
    d. a master PC controller associated with one of the probe assemblies and its associated instrument cluster, and further serving to manipulate the sample stage and to synchronize the testing with the remaining PC controllers, wherein the remaining PC controllers are designated as slave PC controllers; and
    e. a network interconnecting the PC controllers.

2. The system of claim 1 wherein each probe assembly and associated instrument cluster tests the same electrical property of the material.

3. The system of claim 1 wherein each probe assembly and associated instrument cluster tests a different electrical property of the material.

4. A method for the parallel testing of test sites on a sample, the method consisting of:
    a. forming a material on multiple site isolated regions of a sample in a high productivity combinatorial manner;
    b. loading the sample on a sample stage of a probe station wherein the probe station consists of at least two probe assemblies and wherein each probe assembly has two probe tips and in addition has an associated instrument cluster which includes a power supply, current source, voltage source, waveform generator, digital multimeter, device analyzer, and switch matrix and an associated Personal Computer (PC) controller, wherein the PC controllers are networked in a master/slave configuration and wherein hardware in the instrument cluster has additional, independent channels that are used to generate signals and pass data to the PC controller for storage and analysis;
    c. using the master PC controller to manipulate the sample stage to a set of coordinates and causing probe tips of the probe assemblies to contact the sample at multiple test sites;
    d. using the master PC controller to send a signal to the remaining slave PC controllers to initiate electrical tests of the sample;
    e. concurrently testing an electrical property of the material with each probe assembly under the control of the master/slave configured networked PC controllers; and
    f. manipulating the sample stage to a different set of coordinates to continue testing the sample.

5. The method of claim 4 wherein each probe assembly and associated instrument cluster tests the same electrical property of the material.

6. The method of claim 4 wherein each probe assembly and associated instrument cluster tests a different electrical property of the material.

* * * * *